United States Patent [19]

Rostoker et al.

[11] Patent Number: 5,249,098

[45] Date of Patent: * Sep. 28, 1993

[54] SEMICONDUCTOR DEVICE PACKAGE WITH SOLDER BUMP ELECTRICAL CONNECTIONS ON AN EXTERNAL SURFACE OF THE PACKAGE

[75] Inventors: Michael D. Rostoker, San Jose; Tom Ley, Santa Clara, both of Calif.

[73] Assignee: LSI Logic Corporation, Milpitas, Calif.

[*] Notice: The portion of the term of this patent subsequent to May 11, 2010 has been disclaimed.

[21] Appl. No.: 922,118

[22] Filed: Jul. 28, 1992

Related U.S. Application Data

[63] Continuation-in-part of Ser. No. 749,128, Aug. 22, 1991.

[51] Int. Cl.$^5$ .............................................. H02B 00/00
[52] U.S. Cl. ......................................... 361/600; 174/255; 257/778; 361/744; 361/783; 361/807; 361/820
[58] Field of Search ............... 361/331, 380, 388, 396, 361/397, 400, 401, 402, 403, 414, 417, 420; 174/255, 257, 258, 260, 261, 262, 263; 257/678, 686, 778, 779

[56] References Cited

U.S. PATENT DOCUMENTS

| | | | |
|---|---|---|---|
| 3,429,040 | 2/1969 | Miller | 29/626 |
| 3,811,186 | 5/1974 | Larnerd et al. | 29/626 |
| 3,871,014 | 3/1975 | King et al. | 357/67 |
| 4,120,020 | 10/1978 | Uden et al. | 361/386 |
| 4,190,855 | 2/1980 | Inoue | 357/80 |
| 4,355,463 | 10/1982 | Burns | 29/827 |
| 4,545,610 | 10/1985 | Lakritz et al. | 29/589 |
| 4,700,276 | 10/1987 | Freyman et al. | 361/403 |
| 4,700,473 | 10/1987 | Freyman et al. | 29/846 |
| 4,705,917 | 11/1987 | Gates, Jr. et al. | 174/52 FP |
| 4,717,066 | 1/1988 | Goldenberg et al. | 228/179 |
| 4,825,284 | 4/1989 | Soga et al. | 357/80 |
| 4,926,241 | 5/1990 | Carey | 357/75 |
| 4,933,741 | 6/1990 | Schroeder | 357/70 |
| 4,965,702 | 10/1990 | Lott et al. | 361/401 |
| 4,970,575 | 11/1990 | Soga et al. | 357/72 |
| 4,970,577 | 11/1990 | Ogihara et al. | 357/74 |
| 4,972,253 | 11/1990 | Palino et al. | 357/74 |
| 5,006,673 | 4/1991 | Freyman et al. | 174/255 |
| 5,031,069 | 7/1991 | Anderson | 361/321 |
| 5,048,166 | 9/1991 | Wakamatsu | 29/830 |
| 5,077,633 | 12/1991 | Freyman et al. | 361/403 |
| 5,172,303 | 12/1992 | Bernardoni et al. | 361/396 |

FOREIGN PATENT DOCUMENTS

| | | |
|---|---|---|
| 57-210638 | 12/1982 | Japan . |
| 60-49638 | 3/1985 | Japan . |
| 61-142750 | 6/1986 | Japan . |
| 61-145838 | 7/1986 | Japan . |
| 63-239827 | 10/1988 | Japan . |
| 63-268418 | 11/1988 | Japan . |

OTHER PUBLICATIONS

*Led Array Modules by New Technology Microbump Bonding Method*, by Hatada, Fujimoto, Ochi & Ishida, Sep. 1990, IEEE, v. 13, No. 3.

*Packaging Ideas*, by Markstein, May 1992, Electronic Packaging & Production.

*Overmolded Plastic Pad Array Carriers*, by Freyman and Pennisi, 1991, IEEE.

Primary Examiner—Leo P. Picard
Assistant Examiner—Young Whang
Attorney, Agent, or Firm—Gerald E. Linden

[57] ABSTRACT

Wells are formed in an external surface of a semiconductor device package body. Capacitors are disposed within the wells at least partially, and preferably fully within the body. Cleaning channels are formed underneath the capacitors, for removing residual flux and/or solder.

8 Claims, 5 Drawing Sheets

SEMICONDUCTOR DEVICE PACKAGE WITH SOLDER BUMP ELECTRICAL CONNECTIONS ON AN EXTERNAL SURFACE OF THE PACKAGE

CROSS-REFERENCE TO RELATED APPLICATIONS

This is a continuation-in-part of patent application no. 749,128 filed on Aug. 22, 1991 by Tom Ley.

TECHNICAL FIELD OF THE INVENTION

The present invention relates to integrated circuit (IC) packaging techniques, especially ceramic packages.

BACKGROUND OF THE INVENTION

U.S. Pat. No. 4,965,702 discloses a chip carrier package (10) with three layers of conductive planes (14) which are used as power and ground pathways in the package. The conductive planes (14) are separated by dielectric layers (16). Signal lines (24) are provided on a top dielectric layer (18). As noted, generally a dielectric layer will be at least one mil in thickness, and a conductive layer will be 0.7 to 2.8 mils thick.

U.S. Pat. No. 4,972,253 discloses a ceramic package with a central cavity receiving an integrated circuit chip, and a set of conductors ("leads") connecting external pins to the chip. Typically, the leads are provided by a thick film conductor pattern deposited on a ceramic layer.

Modern semiconductor device assemblies have a high (and dense) lead count, and operate at high speeds. Such high speed semiconductor devices must generally be provided with capacitance across power ($V_{DD}$) and ground ($V_{SS}$) to ensure noiseless direct current (DC) even when the best of power supplies are provided, since noise can easily be induced onto the power leads by adjacent signal leads. In this regard, the ultimate solution would be to have capacitors (for power lead filtering) located directly on the semiconductor device (chip). Unfortunately, such a solution is not feasible. Therefore, it becomes highly desirable to locate the capacitors as close to the semiconductor device as possible. In this regard, packaging considerations become paramount. Therefore, it has been generally accepted to mount the capacitors external to the semiconductor device assembly, such as within or adjacent a socket into which the semiconductor device assembly is mounted. In real world terms, this means that the capacitors may be located on the order of a half inch or more away from the semiconductor device. Such a "remote", external mounting of the capacitor(s) presents a real limitation to the operating speed of the semiconductor device. Simply put, capacitors located outside the package of the semiconductor device assembly are of limited use for problems occurring within the package. These problems include power droop, ringing, ground plane bounce and voltage surges.

In the prior art it has been known to incorporate a capacitor having a high dielectric constant within the semiconductor device assembly as part of the die attach pad. However, this solution has a major drawback in that the thermal coefficient of expansion characteristics of the capacitor are not readily matched to the thermal expansion characteristics of the remaining components of the semiconductor device assembly.

Alternatively, it has been known to mount a relatively large capacitor externally, on top of the entire semiconductor device assembly. This solution suffers from excessively long capacitor lead lengths, and a tendency for the externally mounted capacitor to catch on neighboring objects. Neither of these solutions properly solves the problem of getting a capacitor very near to the semiconductor device.

Attention is also directed to commonly-owned, co-pending U.S. patent application No. (Ser. No. 454,751), entitled INTERNAL CAPACITOR ARRANGEMENT FOR SEMICONDUCTOR DEVICE ASSEMBLY, filed on Dec. 9, 1989 by Jon Long, showing internal capacitors.

FIGS. 1 and 2 show a typical prior art, packaged semiconductor device 10. FIG. 1 is an external view, and FIG. 2 is a cross-sectional view. The packaged device 10 includes a body 12, such as a ceramic multilayer package. The package (body) 12 has a top surface 12a and a bottom surface 12b. An integrated circuit device (not shown) is contained within the package 12. Capacitors 14 (a–h) are disposed on the top surface 12a of the package 12. The package 12 may be made of a "series" of laid-up layers of ceramic material 16 interleaved with conductive layers 18. As shown in FIG. 2, there are three top layers 16a, 16b and 16c of ceramic, followed by a power plane 18a, followed by a ceramic layer 16d, followed by a ground plane 18b, followed by alternating intermediate ceramic layers 16e-f and wiring ("trace") layers 18c-d, followed by three bottom ceramic layers 16g-i. Such a plurality of layers is not uncommon, and depends on the number of trace and power layers involved, as well as the mechanical constraints upon the package. In this case, the conductive layers 18a and 18b are for power and ground, and the bottom conductive layers 18c and 18d are for signals. External device leads 19 are connected (connections not shown) to the various traces and planes, by vias (not shown). The conductive traces and planes are nominally about one mil thick, and may be formed of Tungsten, or copper plated with nickel or silver. The present invention is not limited to any particular number of ceramic and conductive layers, nor is it limited to any particular materials or thicknesses.

The capacitors 14 are evidently mounted externally (with respect to the package 12), and are connected to the power and ground planes 18a, 18b within the package 12, as follows. Each capacitor 14 is basically a rectangular block with two tinned (metallic) ends 20. For each capacitor 14, two conductive pads 22 are provided on the top surface 12a of the package 12. The capacitor ends 20 are soldered to the pads 22. As shown in FIG. 2, each pad 22 is connected by a conductive via (line) 24 to a particular wiring layer. In FIG. 2, the capacitor 14a is shown connected by via 24a to the power plane 18a, and by via 24a' to the ground plane 18b. Another capacitor 14h is shown connected by via 24h to the power plane 18a. (Another via, not shown, would connect to the ground plane.) For ceramic packages of the type discussed herein, the ceramic layers (16) are typically 2–12 mils thick and are referred to as "green" tape prior to firing, and the conductive layers (18) are typically 2–8 mils thick.

One problem with the prior art technique of mounting capacitors externally is that the length of the vias 24 is non-trivial. For example, a via 8 mils (i.e., per layer that the via passes through) long can create as much as 2 nh (nanohenries) of inductance (per via), which will effectively offset the capacitance of the capacitor 14. In the example of FIG. 2, the vias 24a extend through three thicknesses of ceramic, and the vias 24 must be 6-36 mils long.

Another problem is that there is only a very small gap 26 (See FIG. 2) between the capacitor 14 and the top surface 12a of the package 12. This small gap, on the order of 3 mils, creates a perfect haven for stray solder balls (not shown) to lodge—in some cases shorting out the two pads 22—and resulting in poor yield. Further, it is difficult to clean our flux from the gap. In light of the relatively high cost of packaging (versus the semiconductor device itself), it is unacceptable to have such problems so late in the manufacturing process.

Another problem is that the externally-mounted capacitor 14 extends a substantial height (in relative terms) above the top surface 12a of the package 12. This undesirably increases the overall thickness of the package, and also usurps otherwise usable space atop the package—space which otherwise would be available for the fins of a heat sink 28, for example (See FIG. 1).

DISCLOSURE OF THE INVENTION

It is therefore an object of the present invention to provide a technique for mounting external capacitors, with shorter lead (via) length.

It is a further object of the present invention to provide a technique for mounting external capacitors, and allow for better cleaning of flux and solder balls, thereby improving manufacturing yield.

It is a further object of the present invention to provide a technique for mounting external capacitors, and allow more space for heat sink fins atop the package.

It is a further object of the present invention to provide a technique for mounting external capacitors, and allow for closer board-to-board spacing. (This refers to the case where packaged devices are mounted to circuit boards, and the external capacitors occupy space between a package and the adjacent board.)

According to the invention, one or more capacitors are mounted within the body of a semiconductor package. "Wells" are formed in an external surface of the package to receive the capacitors. Pads for connecting the capacitors to wiring layers in the package are also recessed within the package body. Channels are also formed under the capacitors to allow for cleaning residual flux and solder balls.

The recessed wells allow the external capacitor to be located physically closer to the wiring planes, so that the length of pad vias (lines) are shortened, and consequently have a shorter inductive path.

The channels allow for cleaning flux and solder balls from underneath the capacitor(s). This alleviates latent solder from shorting adjacent chip pads, and latent flux from contaminating the assembly.

By recessing the capacitor(s), there is less tendency for the capacitor to catch on foreign objects. Further, there is a larger surface area available for heat sinks, and the like. It is also possible to locate an adjacent board closer to the package.

Other objects, features and advantages of the invention will become apparent in light of the following description thereof.

BRIEF DESCRIPTION OF THE DESCRIPTION

DETAILED DESCRIPTION OF THE INVENTION

Figure 1:
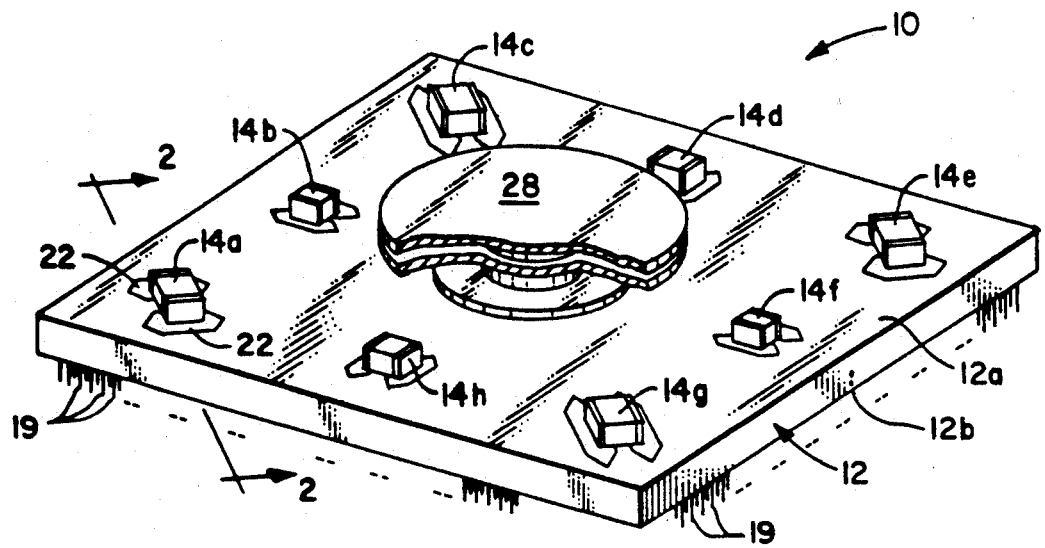
FIG. 1 is a perspective view of a prior art, packaged semiconductor device, with externally-mounted capacitors.
Figure 2:
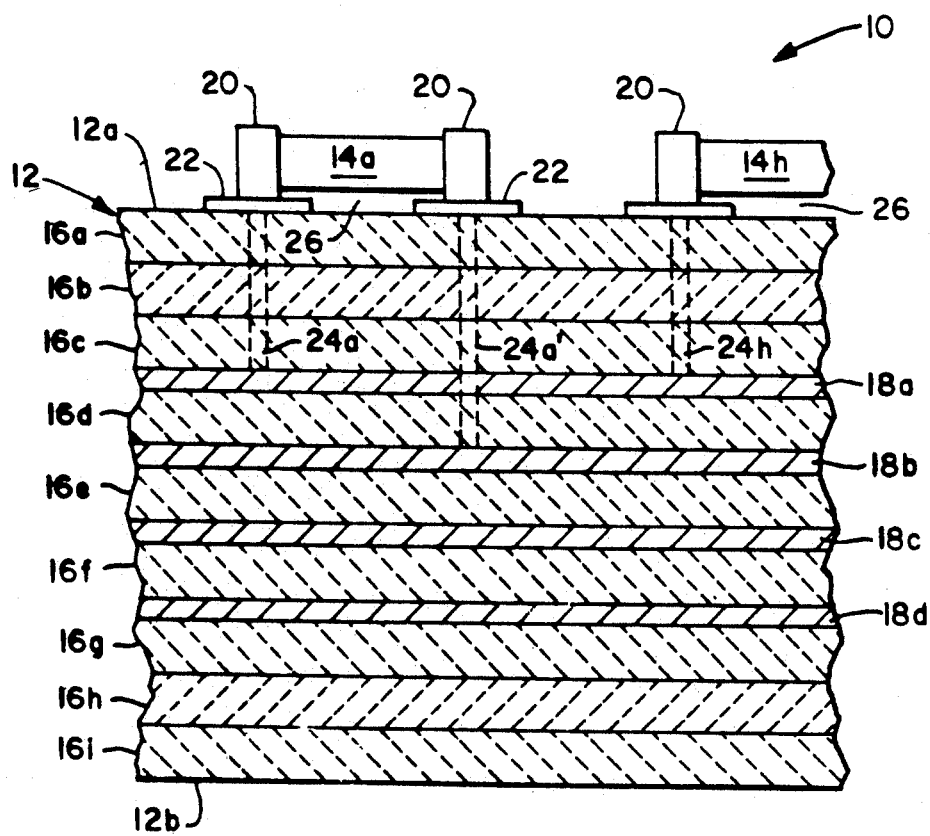
FIG. 2 is a cross-sectional view of the device of FIG. 1, taken on a line 2—2 through FIG. 1.

FIGS. 1 and 2 show a prior art technique for mounting capacitors external to a semiconductor package, and have been discussed hereinabove.

Figure 3:
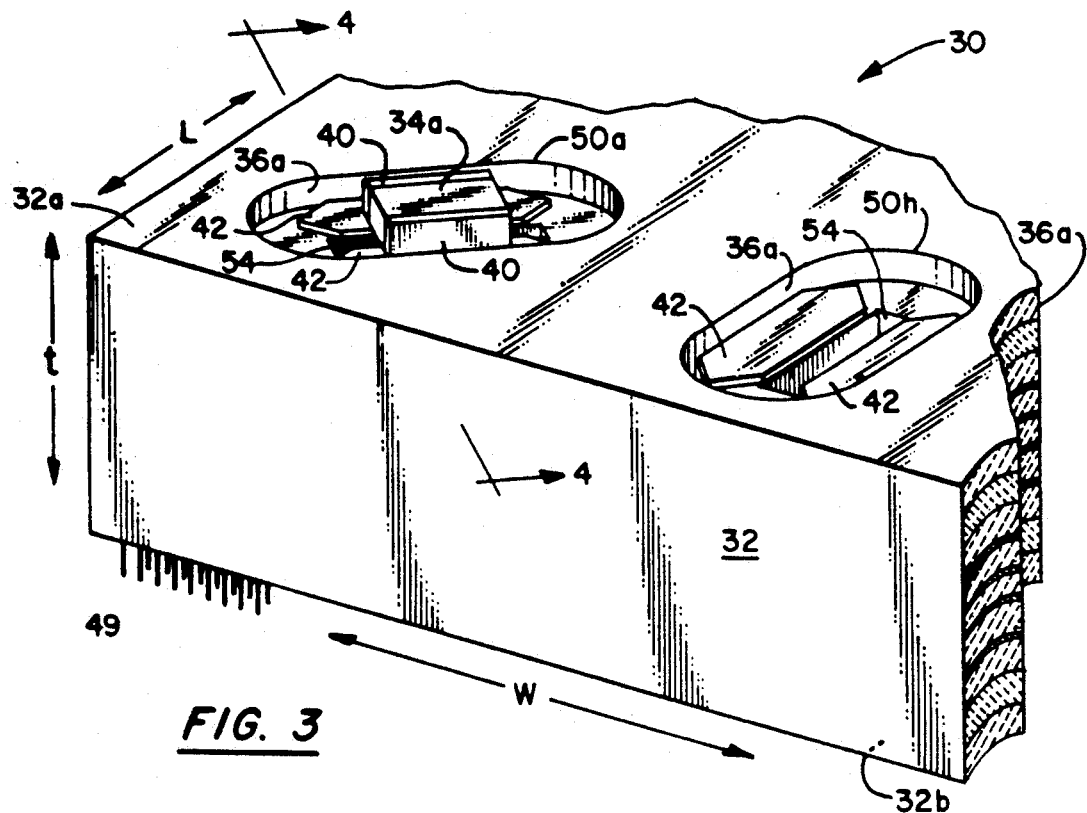
FIG. 3 is a partial perspective view of a packaged semiconductor device, according to the present invention.
Figure 4:
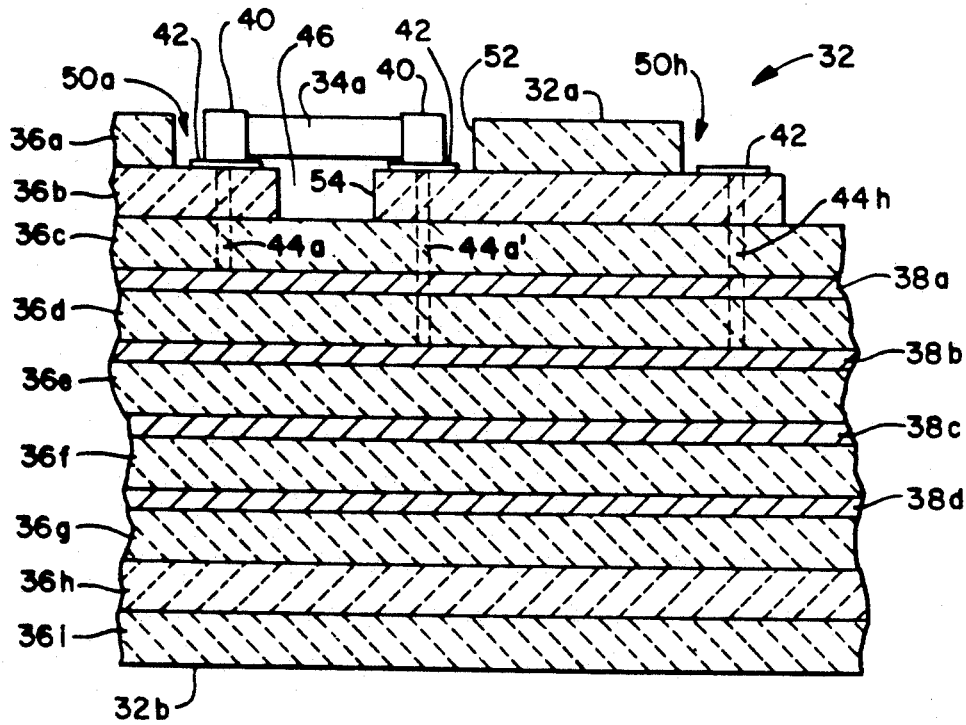
FIG. 4 is a cross-sectional view of the device of FIG. 3, taken on a line 4—4 through FIG. 3.

FIGS. 3 and 4 show a technique for mounting capacitors within the body of the semiconductor package, according to the present invention.

As in the prior art, a packaged semiconductor device 30 includes an integrated circuit (not shown) contained within a package (body) 32. Again, as in the prior art, the package 32 has a top surface 32a and a bottom surface 32b, and can be made of several layers of ceramic material 36 and several conductive layers 38. In this example, the layer count of the exemplary prior art (FIGS. 1 and 2) is preserved, for illustrative contrast. Three top ceramic layers 36a-c are followed a power plane 38a, followed by a ceramic layer 36d, followed by a ground plane 38b, followed by alternating conductive layers 38c-d and intermediate ceramic layers 38e-f, followed by three bottom ceramic layers 38g-i. More layers (each of wiring and ceramic) are possible, and within the scope of the present invention. Again, the top two conductive layers 38a and 38b are for power and ground, respectively, but more power and ground layers, in any order, is not uncommon. External device leads 49 are shown (corresponding to leads 19 in FIG. 1).

In contrast to the prior art, in the present inventive technique, the capacitors 34 (one shown—34a) are mounted recessed within the "body" of the package 32.

The package body 32 has a length (L), a width (W) and a thickness (t), and describes a spatial volume. Typical dimensions for high lead count devices are two inches for the length and width, and 3/32 inch for the thickness.

As in the prior art, the capacitor 34a has a (nominally) rectangular body portion and two metallic end portions 40, and the end portions 40 are soldered to respective conductive pads 42 which, in turn are connected to the power and ground planes by conductive vias 44a, 44a'.

However, unlike the prior art, in this case the capacitors 34 are recessed in "wells" 50 (a..h) within the spatial volume of the package 32, in other words the capacitors 34 are within the body of the package. Two such wells 50 are shown—a well 50a with the capacitor 34a mounted therein, and a well 50h (shown without a capacitor). There would be a plurality of wells disposed about the package, containing a like plurality of capacitors (compare FIG. 1). As viewed in FIG. 4, the wells 50 are created by openings in at least the topmost ceramic layer 36a.

Figure 5:
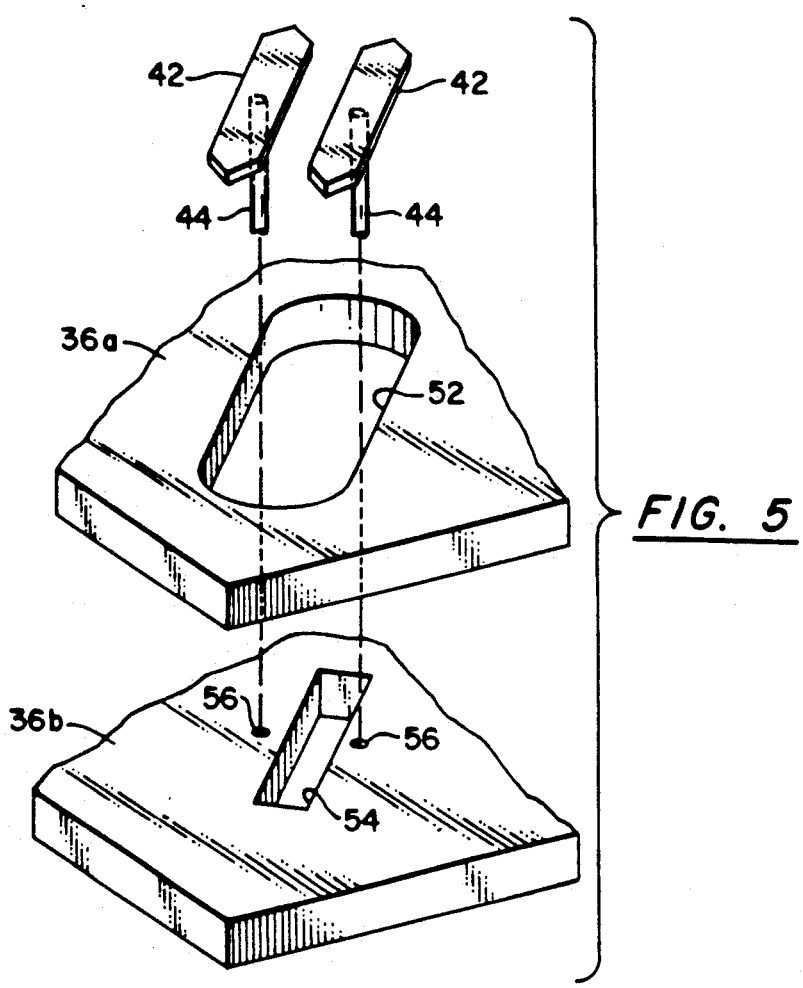
FIG. 5 is an exploded partial view of the device of FIG. 3.

As best viewed in FIG. 5, the top ceramic layer 36a has an opening (through hole) 52, larger than the capacitor 34, to allow the capacitor to be inserted therein. The next ceramic layer 36b has a smaller opening (through hole) 54, smaller than the capacitor (34), and in register with the opening 52. The opening 54 is sized to permit cleaning residual solder balls and flux from underneath the capacitors 34, when they are mounted to the pads 42. The ceramic layer 36b is also provided with two tiny through hole 56, which are sized for the conductive vias 44 to pass through to the power and ground planes.

Each of the layers 36a and 36b can comprise one or more layers of ceramic material, known as "green" tape. The layers 36 and 38 are laid up in a "series".

As is evident in FIG. 4, a gap 46 (formed by the cutout 54; FIG. 5) underneath the capacitor 34 is much larger than the gap 26 underneath the capacitor 14 in FIG. 2, by an amount equal to the thickness of the layer 36b. In this example, an additional 2-12 mils (the thickness of one ceramic layer) of cleaning space (channel) is formed underneath the capacitor 34. This also aids in removal of residual flux and solder balls.

The profile of the pads 42 is shown diamond-shaped, but they can be rectangular or any other suitable shape.

Figure 6A:
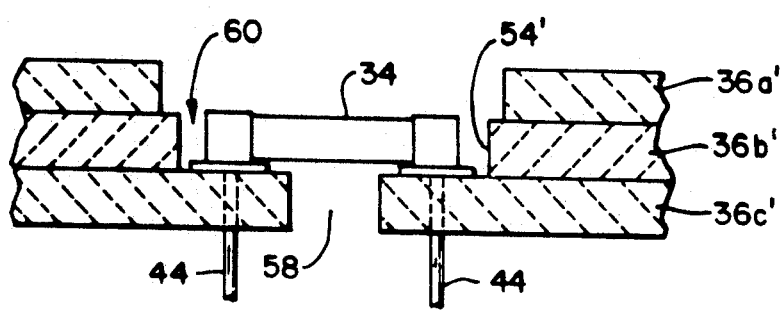
FIG. 6A is a cross-sectional view of an alternate embodiment of the device of FIG. 3.
Figure 6B:
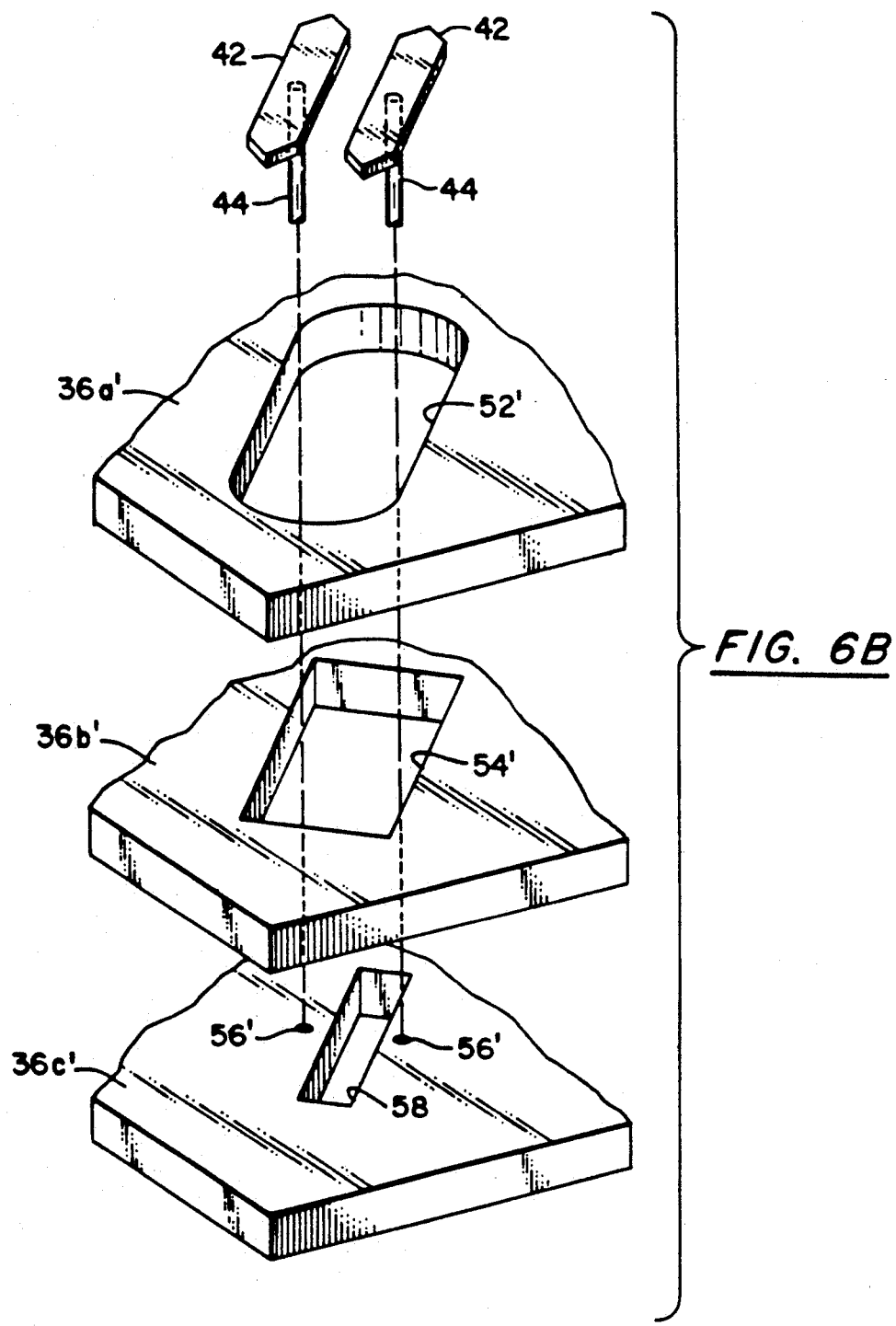
FIG. 6B is an exploded view of the embodiment of FIG. 6A.

FIGS. 6A and 6D show an alternate embodiment of the invention. Again, the capacitors 34 are recessed in wells 60. In this embodiment, a top ceramic layer 36a' (which, again, can be several layers) is provided with a hole 52' sized to allow the capacitor (34, not shown) to fit within the hole 52'. In this case, the second ceramic layer 36b' (which, again, can be several layers) is provided with a hole 54' which is large enough to fit both pads 42 which will ultimately rest upon the next layer 36c'. The layer 36c' is provided with small holes 56' for the conductive vias 44 and with a hole cleaning channel 58. Hence, it may be seen that in this embodiment, 60, the capacitor 34 can be mounted even lower within the body of the package, since the pads are recessed within the second layer 36b' rather than resting atop the second layer (36b, FIG. 5).

In both embodiments, the wells 50 and 60 extend into the body of the semiconductor package to allow for recessed mounting of the capacitors. The capacitors are in this manner disposed at least partially within the body of the package. Preferably, the capacitors are completely recessed. In other words, they will extend no more than flush with the top surface of the package. In both embodiments, there is a sizable gap (channel) beneath the capacitor (as contrasted to the small gap of the prior art). And in both embodiments, the length of conductive vias to a given wiring layer will be reduced. Each of these features have substantial benefits in and of themselves, as discussed hereinabove. Together, the features combine to make an extremely attractive packaging technique which simplifies, in many respects, the manufacturing process.

In both embodiments, the openings 54 and 58 underneath the capacitors form "channels" for cleaning out residual flux and/or solder.

Figure 7:
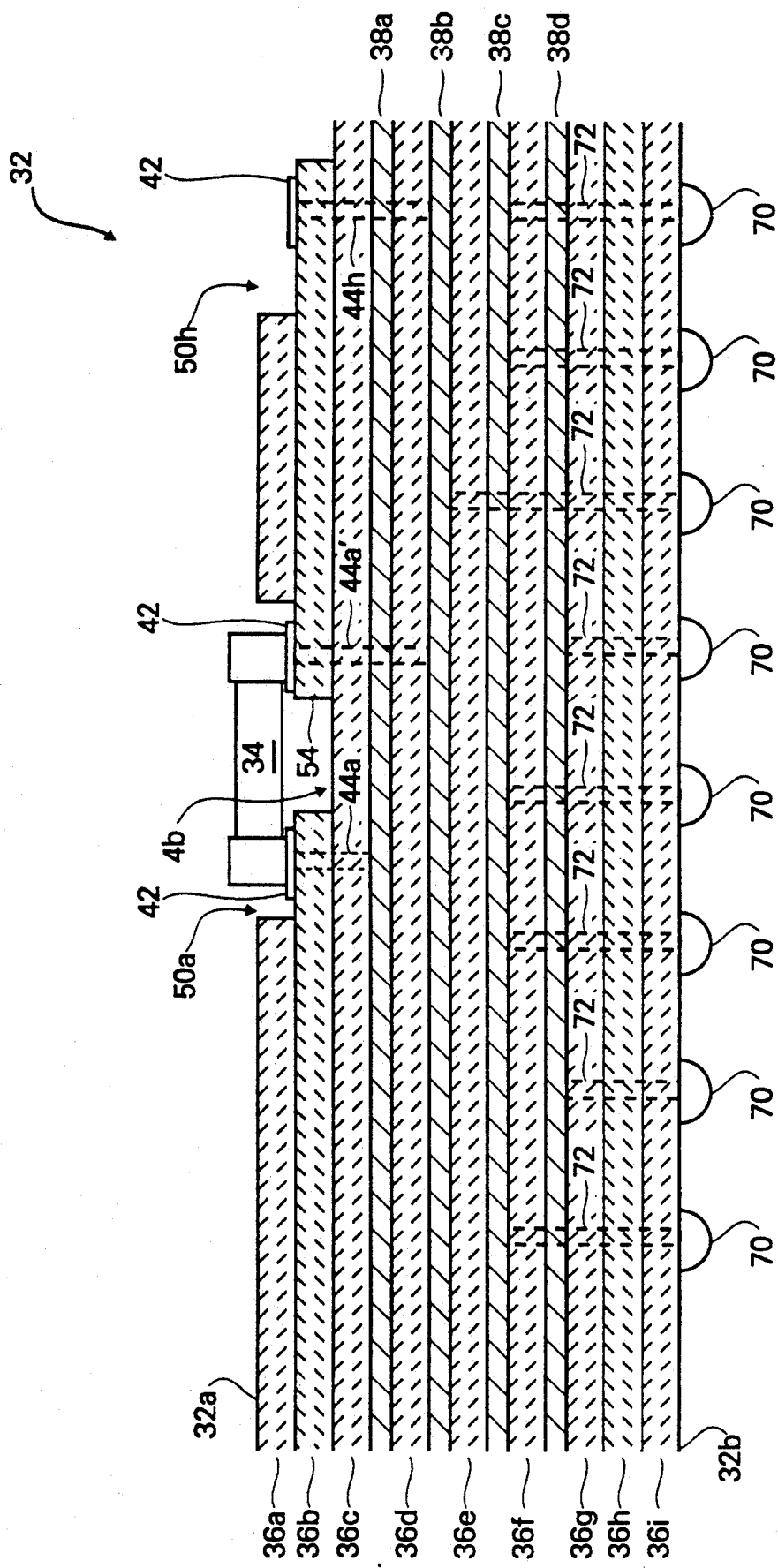
FIG. 7 is a cross-sectional view of an alternate embodiment of the device of FIG. 3.

FIG. 7 shows a cross-sectional view of another alternate embodiment of the present invention, similar to that shown in FIG. 4. This embodiment employs all of the same features as the embodiment shown in FIG. 4, specifically: a portion of a package body 32 having a top surface 32a and a bottom surface 32b, ceramic layers 36a-i, conductive layers 38a-d, "wells" (two shown) 50a and 50h, a capacitor 34 disposed partially within package body 32, pads 42 to which capacitor 34 is mounted, and vias 44a, 44a' and 44h'.

Additionally, however, in this embodiment, a plurality of solder bumps 70 (eight shown) are provided on the bottom surface 32b for the purpose of electrical connection to a printed circuit board (not shown). Each of these solder bumps 70 is connected by a conductive via 72 to one of the conductive layers 38a-d. Connections made by vias 72 may be to signals (e.g., from a semiconductor die) or to power supply connections (e.g., power or ground planes which may be further connected to appropriate points on a semiconductor die). Techniques for providing solder bump connections on a semiconductor package are known to those skilled in the art, and examples of such techniques are given in U.S. Pat. No. 4,700,276 issued on Oct. 13, 1987 to Freyman et al., and in U.S. Pat. No. 4,700,473 issued on Oct. 30, 1987 to Freyman et al., both incorporated herewith by reference.

It is within the scope of this invention that the capacitor wells are formed on the bottom surface rather than the top surface. Evidently, they are most appropriately located on a flat exterior surface (face) of the package body, and on the face closest to the power and ground planes.

While the embodiments discussed above show holes only in the ceramic layers, it is also possible to form the wells by providing holes through the conductive layers, notably through the power or ground planes. For example, a power plane near the surface (32a) can be provided with a hole for receiving the capacitor or forming a channel underneath the capacitor, without appreciable loss in the inherent capacitance of the plane. And, the holes can extend through subsequent (intermediate) ceramic layers.

What is claimed is:

1. A semiconductor device package comprising:
   a body having length, width and breadth and occupying a spatial volume, and having a flat exterior surface;
   a die-receiving opening extending into the flat exterior surface of the body;
   at least one capacitor-receiving opening extending into the flat exterior surface of the body, separate and distinct from the die-receiving opening;
   a capacitor disposed at least partially within each of the at least one capacitor-receiving openings; and
   a plurality of solder bump electrical connections provided on the bottom surface of the flat exterior surface of the body.

2. The semiconductor device package according to claim 1, further comprising:
   a bottom surface in the at least one capacitor-receiving opening;
   a channel formed in and extending into the bottom surface of each of the at least one capacitor-receiving openings underneath the capacitor.

3. The semiconductor device package according to claim 1, wherein:
   the capacitor is disposed completely within the at least one capacitor-receiving opening.

4. A semiconductor device package comprising:
   a body having an external surface and formed of a series of alternating ceramic layers and conductive layers, one of which layer is a first topmost ceramic layer;

a die-receiving opening extending from the external surface through at least the first topmost ceramic layer in the series;
a first hole extending from the external surface through at least the first topmost ceramic layer in the series;
conductive attachment pads within the first hole;
a capacitor disposed within the first hole and attached to the conductive attachment pads, such that the capacitor fits at least partially within the body; and
first conductive vias extending from the pads to one or more of the conductive layers;
a plurality of solder bump electrical connections provided on the external surface; and
second conductive vias extending from the solder bump electrical connections to one or more of the conductive layers.

5. The semiconductor device package according to claim 4, further comprising:
a second hole extending from the first hole through at least one subsequent ceramic layer in the series and forming a channel underneath the capacitor.

6. The semiconductor device package according to claim 5, wherein:
the first hole extending through two or more successive ceramic layers in the series forming an upper portion and a lower portion of the first hole;
the upper portion of the first hole extends through at least the first topmost ceramic layer in the series;
the lower portion of the first hole extends through at least one subsequent ceramic layer in the series and is smaller than the upper portion of the first hole; and
the conductive attachment pads are disposed within the lower portion of the first hole.

7. The semiconductor device package according to claim 4, wherein:
one or more of the conductive layers carries power, and one or more of the conductive layers is ground in use;
one or more of the conductive layers has traces and carries signals, in use; and
the power and ground layers are disposed closer to the external surface than the one or more conductive layers carrying signals.

8. The semiconductor device package according to claim 4, wherein:
the capacitor is disposed entirely within the first hole.

* * * * *